PIEZOELECTRIC OSCILLATOR SYSTEM

Original Filed March 7, 1949

4 Sheets-Sheet 1

INVENTOR
Edward L. Minnich,

By John B. Brady
Attorney

Nov. 16, 1954 E. L. MINNICH 2,694,779

PIEZOELECTRIC OSCILLATOR SYSTEM

Original Filed March 7, 1949

4 Sheets-Sheet 2

INVENTOR

Edward L. Minnich,

By John B. Brady

Attorney

Nov. 16, 1954 E. L. MINNICH 2,694,779

PIEZOELECTRIC OSCILLATOR SYSTEM

Original Filed March 7, 1949 4 Sheets-Sheet 3

INVENTOR

Edward L. Minnich,

By John B. Brady

Attorney

INVENTOR
Edward L. Minnich,
By John B. Brady
Attorney

United States Patent Office 2,694,779
Patented Nov. 16, 1954

2,694,779

PIEZOELECTRIC OSCILLATOR SYSTEM

Edward L. Minnich, Carlisle, Pa., assignor to Selectronics, Inc., Carlisle, Pa., a corporation of Delaware Original application March 7, 1949, Serial No. 79,939, now Patent No. 2,542,045, dated February 20, 1951. Divided and this application September 23, 1949, Serial No. 117,292

7 Claims. (Cl. 250—36)

My invention relates broadly to piezoelectric crystal oscillator systems and more particularly to a circuit arrangement for a piezoelectric crystal system for sustaining oscillations at selected frequencies.

This application is a division of my application Serial Number 79,939, filed March 9, 1949, for Piezoelectric Crystal System, now Patent No. 2,542,045, dated February 20, 1951.

One of the objects of my invention is to provide an improved piezoelectric crystal controlled electron tube oscillator circuit in which the mounting for the piezoelectric crystal includes means supplementing the piezoelectric crystal for facilitating the generation of oscillations in the oscillator circuit.

Another object of my invention is to provide an improved piezoelectric crystal electron tube oscillator circuit in which a piezoelectric crystal is mounted within a metallic housing which also encloses a metallic plate capacitatively related to the said housing and electrically connected in the circuit of the electron tube oscillator for facilitating the sustaining of oscillations generated by the piezoelectric crystal.

Still another object of my invention is to provide a mounting means for a multiplicity of piezoelectric crystals within a metallic housing including means for electrically shielding means to the associated mounting means in such a manner that certain electric condensers normally required in the co-acting oscillator circuit may be omitted and eliminated, thus saving cost in production of electrical apparatus employing such circuits.

Figures 1, 2, 3, 4, 5:
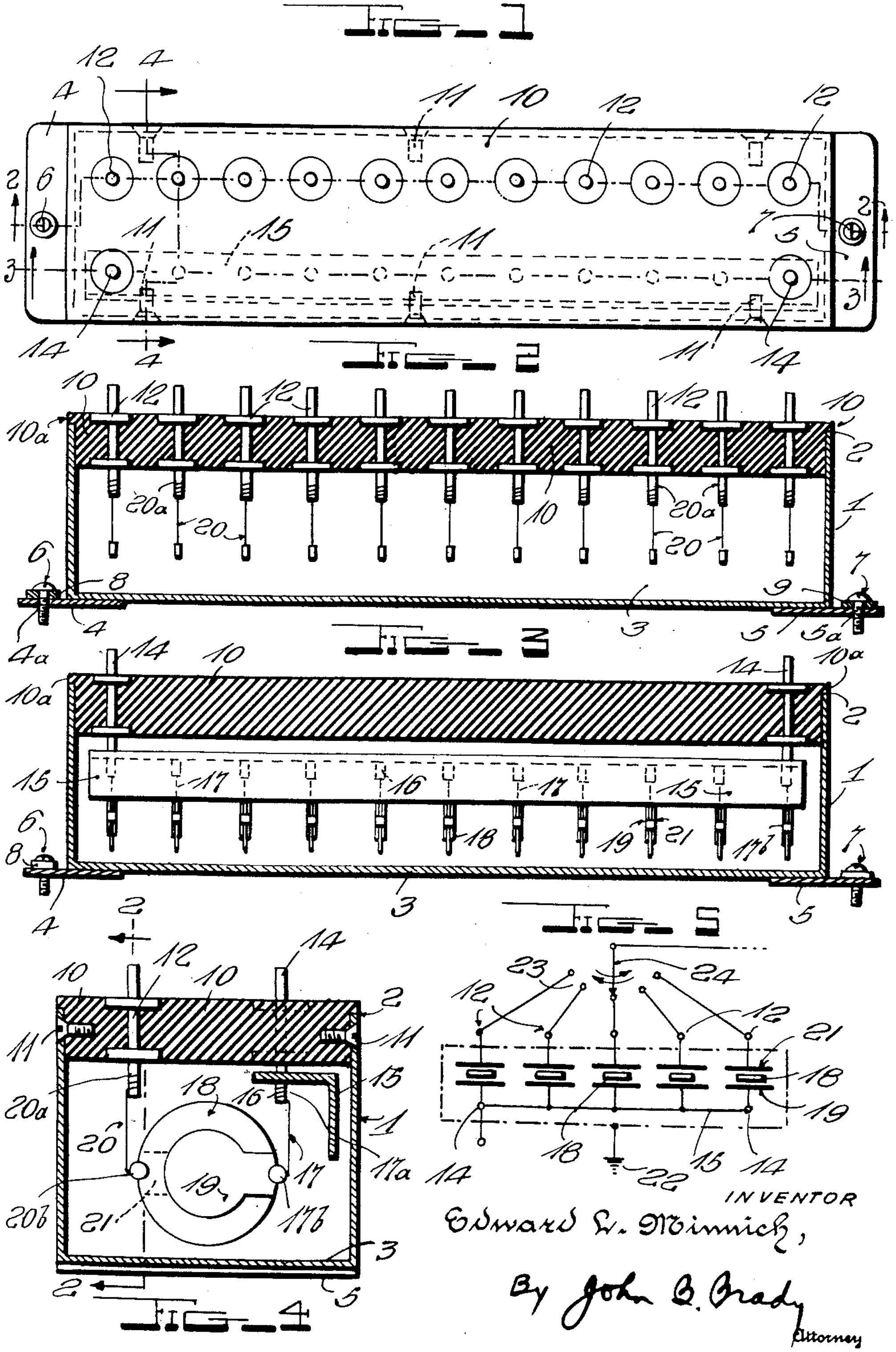
Figures 6, 7, 8, 9:
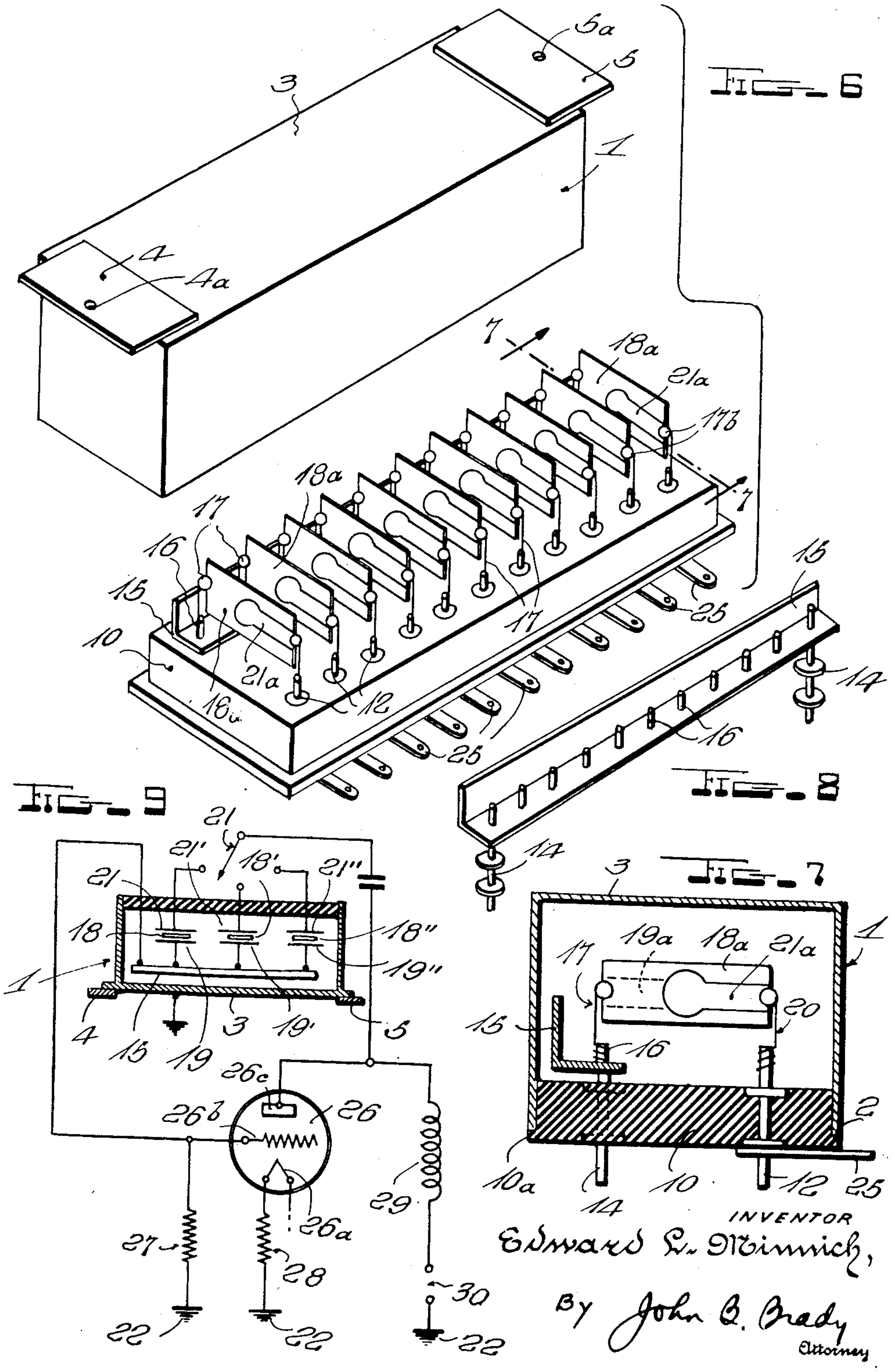
Figures 10, 11, 12, 13, 14, 15, 16:
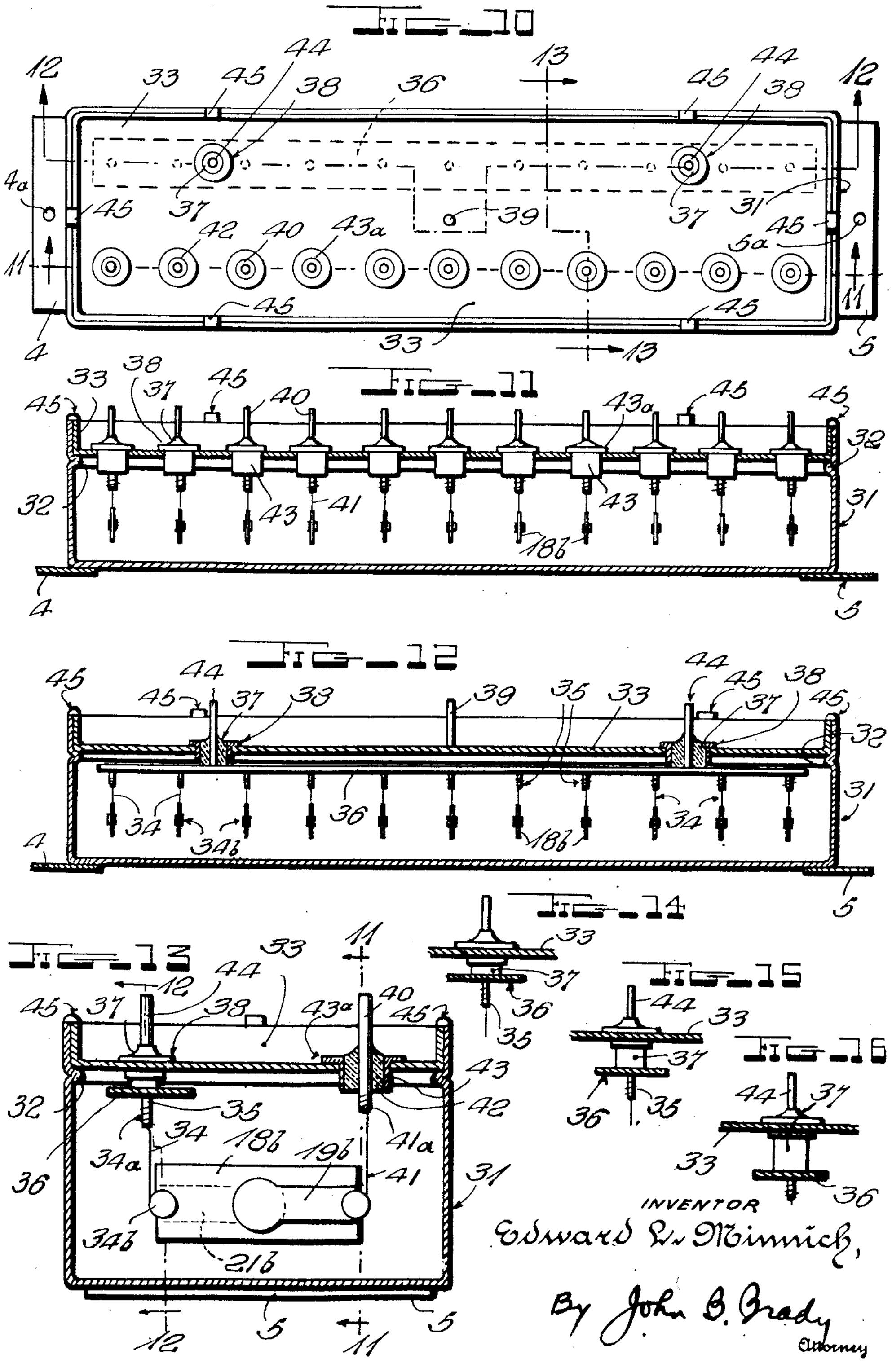
Figure 17:
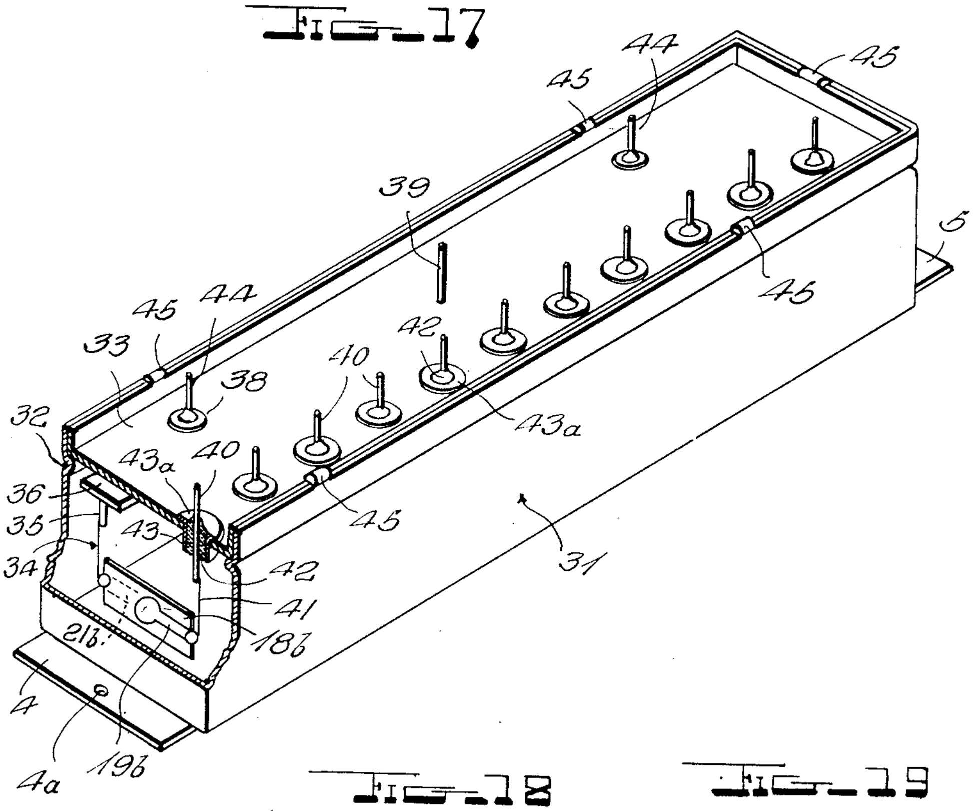
Figure 18:
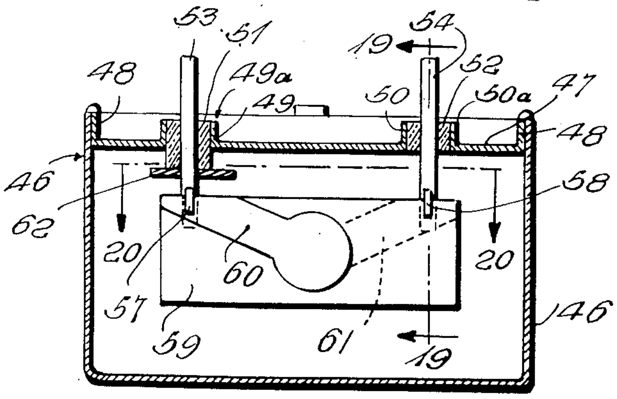
Figure 19:
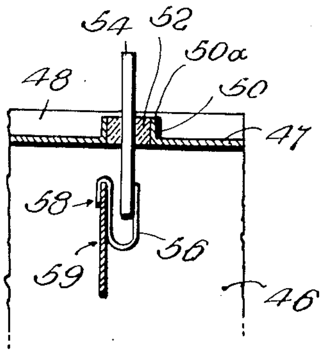
Figure 20:
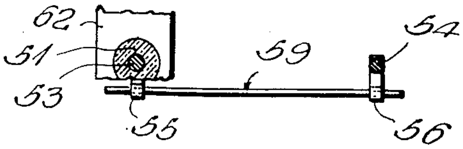

Other and further objects of my invention reside in the circuit arrangement for a piezoelectric crystal oscillator system as set forth more fully in the specification hereinafter following by reference to the accompanying drawings, in which:

Figure 1 is a top plan view of one form of multiple piezoelectric crystal holder employed in the oscillator system of my invention; Fig. 2 is a longitudinal sectional view through the multiple piezoelectric crystal holder taken substantially on line 2—2 of Fig. 1 and Fig. 4; Fig. 3 is a longitudinal sectional view through the multiple piezoelectric crystal holder taken substantially on line 3—3 of Fig. 1; Fig. 4 is a transverse sectional view taken substantially on line 4—4 of Fig. 1; Fig. 5 is a schematic wiring diagram illustrating the manner of selecting the individual piezoelectric crystals in the multiple piezoelectric crystal apparatus of my invention; Fig. 6 is a perspective view of the multiple piezoelectric crystal holder showing the parts of the holder in juxtaposition ready for assembly in a compact assembly; Fig. 7 is a transverse sectional view taken through the assembled piezoelectric crystal holder shown in Fig. 6 with the parts assembled, the view being taken substantially on line 7—7 of Fig. 6; Fig. 8 is a perspective view showing the capacitor element employed within the casing of the apparatus; Fig. 9 is a schematic view showing the oscillator circuit arrangement of my invention by which certain condensers in the oscillator are compensated for and omitted or eliminated by use of the construction of multiple piezo crystal holder of my invention; Fig. 10 is a top plan view of a modified form of multiple piezo crystal apparatus employing my invention in which individual insulators are employed for insulating the piezoelectric crystals from the metallic housing of the piezoelectric crystal apparatus; Fig. 11 is a longitudinal sectional view taken substantially on line 11—11 of Fig. 10 and Fig. 13; Fig. 12 is a longitudinal sectional view through the multiple piezoelectric crystal apparatus taken substantially on line 12—12 of Fig. 10 and Fig. 13; Fig. 13 is a transverse sectional view taken substantially on line 13—13 of Fig. 10; Figs. 14, 15 and 16 show modified arrangements for fixing the effective capacity of the capacitor that is built into the multiple crystal holder by spacially relating the capacitor strip by differing dimensional amounts with respect to the casing; Fig. 17 is a perspective view of the piezoelectric crystal apparatus shown in Figs. 10–13 with parts broken away to illustrate the internal construction more clearly; Fig. 18 is a transverse sectional view through a modified form of multiple piezoelectric crystal apparatus embodying my invention; Fig. 19 is a fragmentary longitudinal sectional view taken substantially on line 19—19 of Fig. 18; and Fig. 20 is a horizontal sectional view taken substantially on line 20—20 of Fig. 18.

I have developed the apparatus of my invention to meet the requirements of electronic apparatus employing multiple piezoelectric crystals. In certain forms of radio broadcast receivers a multiplicity of piezoelectric crystals are employed of the order of twenty-one or more. The problem of mounting such crystals within the allowable extremely small area in such manner that adequate insulation is assured for the individual crystals is a very severe one. I have shown a multiple piezoelectric crystal holder herein in which the overall length of the casing constituting the crystal housing for housing eleven crystals is but 4⁵⁄₁₆″, while the overall width of the casing is but 1¹⁄₁₆″, and the heighth is but ⅞″.

I provide a construction of multiple crystal holder which assures adequate insulation for the individual piezoelectric crystals within the casing which forms an electrical shield. A capacitor member is built into the piezoelectric crystal holder and electrically connected with one side of each of the piezoelectric crystals and spacially related to the electrical shield constituting the casing. This arrangement when connected with the electron tube oscillator circuit of my invention completes a capacitative feed-back path for the oscillation circuit, thereby enabling the feed-back condenser normally required in the oscillation circuit to be omitted and eliminated. This reduces expense in manufacture and production of radio broadcast receivers of the multiple piezoelectric crystal type which in a mass production program may involve very sizeable amounts. The apparatus of my invention involves novel mounting means for the individual piezoelectric crystals by which adequate support of each of the piezoelectric crystals within the shielded housing is assured in a very practical manner. I may employ piezoelectric crystals of various cuts and types as typified for example by the circular crystal of Fig. 4 or the rectangle crystals of Figs. 6, 7, 13 and 17, 18, 19 and 20.

Referring to the drawings in detail, reference character 1 designates the metallic shielding container or tank having an open top terminating in a peripheral edge 2 and having a closed metallic bottom 3. Extension lug members 4 and 5 are secured to opposite ends of the external face of the closed bottom 3 of the shielding container 1. The lugs 4 and 5 each contain apertures 4a and 5a that permit the passage of securing screws 6 and 7 which extend through the washers 8 and 9 and enter the supporting surface such as the chassis of associated electronic apparatus, which may be a radio receiver and the like.

A panel formed from insulation material 10 having a peripheral flange 10a thereon enters the open end 2 of the tank 1 and is secured with respect to the tank 1 by appropriate securing screws 11. I mount a multiplicity of terminal posts 12 corresponding in number to the number of piezoelectric crystals supported in the holder on the panel of insulation material 10 in a row extending longitudinally of the holder as shown in Figs. 1 and 2.

In positions transversely opposite each of the end terminal posts in the row of terminal posts 12 I provide terminal posts 14 insulatingly and spacially related thereto. Terminal posts 14 serve as supports and electrical connectors for the capacitor strip 15 which extends longitudinally of the casing 1. The strip 15 is formed from metal stock approximately .040″ to .050″ thick and ¼″ wide. In the dimensional example heretofore given this strip is approximately 4" in length. In the form of my invention shown in Figs. 1–8 the capacitor strip 15 is in the form of an angle having flanges extending in planes substantially normal to each other with one flange thereof, approximately ¼" wide, extending in spacial capacitive relation with the interior side wall of metallic container 1. This forms a condenser in the circuit path of each of the piezoelectric crystals. Small studs 16 are welded or otherwise secured to strip 15 and project therefrom in an upright position serving as supports for springs 17. In the dimensional example heretofore referred to these studs are spaced approximately ⅜" apart which permits mounting of a plurality of spaced crystals within the container 1 without mutual contact. Springs 17 connect with one of the ends of the several piezoelectric crystals 18 shown in Fig. 4 and establish electrical and mechanical connection with electrode 19 thereon. The other ends of the piezoelectric crystals 18 are supported in springs 20 projecting from terminal posts 12 and establishing electrical and mechanical connection with electrodes 21 on the opposite faces of the crystals.

The terminal posts 12 and 14 have annular flanges thereon that are embedded in the insulation material of panel 10 for solidly anchoring the posts in the panel. The posts 12 and 14 project through the material of panel 10 and provide external connection means to the electronic oscillator system outside of the casing 1. The terminal posts 14 adjacent opposite ends of casing 1 serve as both electrical connecting means and mechanical supports for the strip 15.

The springs 17 and 20 which serve as supporting members for the individual piezoelectric crystals 18 comprise coils of spring wire 17a and 20a which respectively embrace the inwardly directed studs 16 and the inwardly directed terminal posts 12. The other ends of springs 17 and 20 terminate in looped or coiled ends 17b and 20b disposed in the same plane in spaced positions within the container 1 to grip the electrodes of the piezoelectric crystal 18 therebetween.

Each piezoelectric crystal 18 has the opposite conductive electrodes 19 and 21 thereof which are secured to opposite faces of the piezoelectric crystal intimately connected with the spring wire loops or coils 17b and 20b by low melting point metal which assures a rigid mechanical support between the spring wires 17 and 20 and the piezoelectric crystal 18 and a highly conductive electrical connection with the electrodes 19 and 21 of the crystal 18. This connection is so sturdy and reliable that even though the multiple piezoelectric crystal holder is subjected to very substantial vibration or in fact, mechanical shock, the crystals are retained in the grip of the spring wire coils or loops 17b and 20b. By reason of the structural section of the strip 15 such vibration or shock does not appreciably displace the strip or impair the established capacitative relation thereof to the wall of the metallic container 1.

In Fig. 5 I have illustrated the circuit arrangements for the piezoelectric crystal elements from which it will be noted that one longitudinal row of terminals is constituted by capacitor strip 15, capacitively related to the metallic wall of container 1 which is grounded at 22. The other row of terminals is constituted by spaced terminal posts 12 which individually connect with the opposite sides of each of the piezoelectric crystal elements. The several piezoelectric crystal elements connect to contacts arranged compactly in the arc of a circle as represented at 23, over which the switch arm 24 operates to select a particular piezoelectric crystal from the group of piezoelectric crystals 18. In Fig. 5 I have schematically shown only five piezoelectric crystals but it will be understood that any multiple number of such elements may be employed.

In Fig. 6 I have shown the shielded container 1, removed from the panel 10 of insulation material and disposed in juxtaposition with respect thereto, and showing in perspective view the piezoelectric crystal elements which are normally housed within the container. The piezoelectric crystal elements in this arrangement are rectangular, as shown at 18a, instead of circular as shown in Fig. 4 at 18, but all other details are arranged as explained in connection with Figs. 1–5. The posts 12 in this arrangement are illustrated as having solder lugs 25 connected to the externally projecting stems of the terminal posts and extending in spaced relation beyond the periphery of the panel 10 for permitting individual electrical connection to be readily made thereto. The electrodes on the surfaces of the piezoelectric crystals are arranged in a manner explained in connection with Fig. 4 but by reason of the rectangular shape of the crystals the electrodes are elongated as represented at 19a and 21a of Figs. 6 and 7.

Fig. 7 illustrates on a somewhat larger scale the manner in which the rectangular piezoelectric crystals are spacially disposed within container 1 while capacitative coupling is established between strip 15 and the metallic wall of container 1.

In Fig. 9 I have represented the electrical circuit of the electron tube oscillator which is associated with the multiple piezoelectric crystals within the container 1. The metallic wall of the metallic container or tank 1 forms one capacity area of an electrical condenser in co-action with the capacitor strip 15. Electron tube oscillator 26 is schematically shown as including cathode 26a, control grid 26b and an anode 26c. The control grid 26b is connected in the input circuit of the oscillator through the impedance 27 to ground 22. Cathode 26a is connected with the output circuit of the oscillator including radio frequency choke coil 29 and high potential source indicated at 30, and ground connection 22. The piezoelectric crystal elements represented at 18, 18', 18'', etc. have the electrodes 19, 19', 19'', etc., thereof, respectively connected to capacitor strip 15.

The electrical capacity between electrodes 19, 19', 19'' and the metallic container 1 is established by the spacial relation of metallic strip 15 and the metallic wall of the container 1. The electrical capacity thus provided constitutes a feed-back path for oscillations between the input and output circuits of the oscillator 26. This capacity compensates for and takes the place of an external condenser which must normally be included in the input circuit of the oscillator in shunt with impedance 27 in the input circuit. Accordingly, by spatially relating capacitor strip 15 to metallic container 1 internally of the container, the essential feed-back capacity may be provided between the input or output circuits of the oscillator without the necessity of installing the separate condenser normally required. This results in a very appreciable saving in a manufacturing and production program where many thousands of such condensers would be required.

In Figs. 10–20 I have shown a modified form of multiple crystal holder which may be used in the circuit of my invention in which the metallic housing 31 is substituted for the shielding container or tank 1. The metallic housing 31 has a peripheral bead 32 adjacent the extremity of the edge thereof which provides a peripheral seat for the inverted metallic pan member 33.

The inverted metallic pan 33 is peripherally supported by the peripheral seat 32 when the pan 33 is frictionally forced into the housing 31. The pan 33 forms a support for the multiplicity of piezoelectric crystal elements. In this arrangement one row of piezoelectric crystal element supports represented by the resilient wire-like spring elements 34 are attached by coils 34a to studs 35 depending from capacitor strip 36 and terminate in loops 34b which embrace the ends of piezoelectric crystal elements 18b for establishing electrical connection with the electrode surface 19b and 21b as represented in Fig. 13. The capacitor strip 36 is insulatingly and spacially mounted with respect to pan 33 by means of terminal posts 44 that pass though bushings 37 of insulation material supported in sleeve-like bushings 38 extending through the pan 33. A common terminal connection for the container 31 projects from the rear of pan 33 as shown at 39. The co-acting opposite terminals for each of the multiple number of piezoelectric crystal elements are insulated from the metallic pan 33.

Terminal posts 40 individual to each of the resilient wire-like members 41 are gripped by the coiled ends 41a of the resilient wire-like members 40 as shown in Fig. 13. The terminal posts 40 pass through bushings formed by insulation material 42 carried in sleeve-like members 43. The sleeve-like members 43 each have annular flanges 43a thereon and are seated in a longitudinally extending row of apertures provided in pan 33. The insulation material 42 is vitreous or is formed from composite insulation material and substantially insulates terminal post 40 from contact with metallic sleeve 43 or metallic pan 33. The terminal posts 40 projects beyond the peripheral limits of pan 33 and enable electrical connections to be made thereto for completing circuits to the individual piezoelectric crystal elements.

The opposite extremities of the metallic housing 31 or the pan 33 may be rolled over to provide a peripheral interlocking joint, or spaced lugs 45 may be provided on housing 31 and may be rolled over the peripheral edge of pan 33 to secure pan 33 in position against peripheral seat 32 and within housing 31.

The same method of mounting the metallic housing 31 is provided as is employed in the arrangement of Figs. 1–8; that is, lugs 4 and 5 are perforated at *4a* and *5a* for the passage of securing screws.

The electrical capacity referred to in Fig. 9 is inherently provided in the multiple piezoelectric crystal holder of Figs. 10–13, eliminating and replacing feed-back condenser normally required in the oscillator circuit. In order that different values of capacity may be provided within the crystal holder I may selectively fix the length of insulation bushings 37 as represented in Figs. 14, 15 and 16 to fix the spacial relation of capacitor strip 36 and the metallic pan 33. For example, the short bushing 37 in Fig. 14 provides a relatively high capacity value; the bushing 37 of greater length shown in Fig. 15 provides a capacity of lower value, while the bushing 37 of the longest length as shown in Fig. 16 provides an effective capacity within container 31 of the smallest value.

The manner of supporting the piezoelectric crystals in the form of my invention illustrated in Figs. 10–13 is the same as that described in connection with the form of my invention shown in Figs. 1–8, and I have applied similar reference characters to corresponding parts of the crystal and the electrodes thereof by adding the subscript *a* to the crystal and the electrodes thereof.

In Figs. 18–20 I have illustrated a further modified form of multiple crystal holder in which a metallic housing 46 is provided, closed on all sides except one which is closed by a metallic pan 47 having a peripheral edge 48 operative to engage the edge of housing 46. The pan 47 is apertured in transverse aligned positions at 49 and 50 with outstruck sleeves 49a and 50a co-extensive with the pan 47. The sleeves 49a and 50a are filled with insulation material 51 and 52 forming supports for the pin members 53 and 54.

The pin members 53 and 54 each carry spring strips on the ends thereof as represented at 55 and 56. The spring strips 55 and 56 are each folded upon themselves to form spring clamping jaws 57 and 58. These spring clamping jaws grip and engage opposite sides of the piezoelectric crystal which in this instance is represented by reference character 59 with opposite electrodes 60 and 61 thereon. The electrodes 60 and 61 extend from the center of crystal 59 to opposite corners serving as a metallic coating which is gripped by the spring clamping jaws 57 and 58. Solder or low melting point metal is applied between the metallic electrode 60 and spring jaw 57 and between metallic electrode 51 and spring jaw 58 for electrically and mechanically maintaining the piezoelectric elements in position in the multiple piezoelectric crystal holder. This clamping method is comparable to the clamping method employing the spring coils or loops of Figs. 1–13, in that the piezoelectric crystal elements are maintained in position and cannot be accidentally or readily shaken or displaced from the securing means.

The capacitor strip 62 is mounted on pin members 53 spaced from pan 47 by the insulation supports 51 in capacitative relation to the underside of pan 47. An electrical circuit grounded to the metallic housing 46 inherently places the electrical capacity existent between the ground and one of the electrodes of the piezoelectric crystals in shunt with the input circuit of the oscillator in the manner explained in connection with the circuit of Fig. 9.

With the advent of piezoelectric crystal apparatus functioning on many closely adjacent frequencies in multiple signaling channels, the importance of the multiple piezoelectric crystal apparatus of my invention will be appreciated. The large number of individual piezoelectric crystal elements of different frequency characteristics may be mounted within an extremely small space on racks or adjacent an apparatus chassis for efficiently providing for the selective operation of numerous electrical circuits on closely adjacent frequencies.

One of the advantages arising out of the application of the multiple crystal holder of my invention results from the fact that it is difficult and costly to finish a crystal to a precise frequency, and the wider the finishing tolerance, the lower the production cost. Crystals which cover the broadcast band may be ground to a relatively wide finish frequency tolerance by controlling the amount of plating on the surfaces of the crystals, and then grouping or classifying these crystals as to the number of cycles to which they may be high or low with respect to the precise frequency or desired frequency. The crystals may be classified in at least three groups, as being high, medium (or on), and low, and may include two other classifications, as extremely high and extremely low frequency tolerance crystals.

An oscillator circuit does have some influence on the frequency of the crystal, and if the grid to ground capacity of a Pierce oscillator, for example, is varied the frequency is changed appreciably and may bring the crystals into tolerance, providing they are finished at some frequency not too far removed from the desired frequency. If the crystal frequency is higher than the desired frequency the capacity would be increased across the grid to ground. Conversely, if the crystal frequency is lower than the desired frequency, the capacity is reduced.

From the foregoing it will be understood that the holder may be made in three to five steps with respect to the value of this built-in capacitor, which is connected between the grid of the oscillator and the ground. The crystals noted as "high" or "extremely high" are put in holders with the maximum value of inbuilt capacity. The crystals classified as "low" or "extremely low" are put in a holder with the minimum capacity, and those crystals classified as "medium" or "on" would go into a holder with an average or medium value of capacity. As hereinbefore stated this makes the finishing operation considerably more simple, thereby reducing manufacturing costs. This is a substantial advantage to the crystal manufacturer and can be passed on to the customer in lower price of the units.

While I have described my invention in certain of its preferred embodiments I realize that modifications may be made in the arrangement of parts, the circuit details, and elements of the apparatus and I desire that it be understood that no limitations upon my invention are intended other than may be imposed by the scope of the appended claims.

What I claim as new and desire to secure by Letters Patent of the United States is as follows:

1. A piezoelectric crystal system comprising in combination, an electron tube having input and output circuits, a piezoelectric crystal system including a piezoelectric plate, a metallic envelope extending from a base of insulation material and enclosing said piezoelectric crystal plate, a capacitor strip mounted inside said envelope in spatial insulated relation to the interior surface of one of the metallic walls thereof and a plane substantially normal to the plane of said piezoelectric plate and electrically connected with one side of said piezoelectric crystal plate, and electrical connections extending through said base of insulation material between the input and output circuits of said electron tube and one side of said envelope, the electrical capacity existent between said envelope and said capacitor strip providing an electrostatic feed-back path between said circuits.

2. A piezoelectric crystal system comprising in combination an electron tube having input and output circuits, a piezoelectric crystal element electrically connected between said input and output circuits, a metallic envelope extending from a base structure of insulation material and surrounding said piezoelectric crystal element, circuit connections extending through said base structure, a capacitor element disposed inside said envelope in insulated spatial relation to one interior wall of said metallic envelope and extending in a plane substantially normal to the plane of said piezoelectric crystal element and electrically connected with one side of said piezoelectric crystal element for establishing by said spacial relation a feed-back path between said input and output circuits for sustaining electrical oscillations in said circuits under control of said piezoelectric crystal element.

3. A piezoelectric crystal system comprising in combination an electron tube having input and output circuits, a piezoelectric crystal electrically connected with said circuits, a metallic envelope extending from a base structure of insulation material and surrounding said piezoelectric crystal, circuit connections extending through said base structure, and a metallic strip disposed inside said envelope between one edge of said crystal and one of the walls of said envelope, a connection between said strip and one side of said piezoelectric crystal, said strip being insulatingly and capacitatively related to one interior wall of said envelope for establishing a feed-back path for oscillatory currents between said circuits.

4. A piezoelectric crystal system comprising in combination an electron tube having input and output circuits, a piezoelectric crystal electrically connected with said circuits, a metallic envelope extending from a base structure of insulation material and surrounding said piezoelectric crystal, circuit connections extending through said base structure, and means disposed inside said envelope intermediate one edge of said crystal and one interior wall of said envelope and supplementing said piezoelectric crystal for establishing a feed-back path for oscillatory current between said circuits.

5. A piezoelectric crystal system comprising in combination an electron tube having input and output circuits, a piezoelectric crystal electrically connected with said circuits, a metallic envelope extending from a base structure of insulation material and surrounding said piezoelectric crystal, circuit connections extending through said base structure, and means disposed between one edge of said crystal and the interior wall of said envelope and capacitatively related to said interior wall and electrically connected with said piezoelectric crystal for establishing a feed-back path for oscillatory currents between said circuits.

6. A piezoelectric crystal system comprising in combination an electron tube having input and output circuits, a piezoelectric crystal, a pair of supports for mounting said piezoelectric crystal, said crystal being electrically connected with said circuits, a metallic envelope extending from a base structure of insulation material and surrounding said piezoelectric crystal, circuit connections extending through said base structure, and a capacitor element mounted on one of the supports which mount said piezoelectric crystal and extending in a plane substantially normal to the plane of said piezoelectric crystal and spacially related to the interior wall of said metallic envelope and electrically connected to one side of said piezoelectric crystal for establishing a feed-back path for oscillatory currents between said circuits.

7. A piezoelectric crystal system comprising in combination an electron tube including at least a cathode, a grid and a plate and having input and output circuits, a piezoelectric crystal, a supporting base of insulating material, supports extending through said supporting base and providing exterior terminals, means for mounting said piezoelectric crystal on said supports, a capacitor strip constituted by a metallic angle member mounted on one of said supports, a metallic housing detachably connected with said supporting base and enclosing said piezoelectric crystal and said metallic angle member, said metallic angle member including flanges disposed in planes extending normal to each other with one of said flanges extending in parallel relation to the interior of said base and the other of said flanges imparting rigidity to the aforementioned flange and extending in spaced relation to one interior side wall of said metallic envelope, connections between said piezoelectric crystal and the grid and plate electrodes of said electron tube, and electrical connections between the input and output circuits of said electron tube and one side of said envelope, the electrical capacity existent between said envelope and said capacitor strip providing an electrostatic feed-back path between said circuits.

References Cited in the file of this patent

UNITED STATES PATENTS

| Number | Name | Date |
|---|---|---|
| 1,933,979 | Hentschel | Nov. 7, 1933 |
| 1,994,228 | Osnos | Mar. 12, 1935 |
| 2,260,707 | Fair | Oct. 28, 1941 |